US008912866B2

(12) United States Patent
Yasuda

(10) Patent No.: US 8,912,866 B2
(45) Date of Patent: Dec. 16, 2014

(54) DUAL-BAND SURFACE ACOUSTIC WAVE FILTER AND COMPOSITE HIGH-FREQUENCY COMPONENT

(71) Applicant: Murata Manufacturing Co., Ltd., Nagaokakyo-shi, Kyoto-fu (JP)

(72) Inventor: Junpei Yasuda, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 287 days.

(21) Appl. No.: 13/677,818

(22) Filed: Nov. 15, 2012

(65) Prior Publication Data

US 2013/0069742 A1 Mar. 21, 2013

Related U.S. Application Data

(63) Continuation of application No. PCT/JP2011/053942, filed on Feb. 23, 2011.

(30) Foreign Application Priority Data

Jun. 11, 2010 (JP) ................................. 2010-134017

(51) Int. Cl.
*H03H 9/72* (2006.01)
*H03H 9/76* (2006.01)
*H03H 9/64* (2006.01)
*H03H 9/05* (2006.01)

(52) U.S. Cl.
CPC ............... *H03H 9/64* (2013.01); *H03H 9/0542* (2013.01); *H03H 9/0576* (2013.01); *H03H 2250/00* (2013.01)
USPC ............................................ 333/133; 455/78

(58) Field of Classification Search
USPC ............. 333/133, 193–196; 455/78–82
See application file for complete search history.

(56) References Cited

U.S. PATENT DOCUMENTS

| 6,870,440 B2* | 3/2005 | Komazaki et al. ............ 333/133 |
| 2003/0146805 A1* | 8/2003 | Sawada ........................ 333/133 |
| 2004/0042186 A1 | 3/2004 | Furukawa et al. |
| 2004/0080378 A1 | 4/2004 | Furutani |
| 2007/0229189 A1 | 10/2007 | Iwata |
| 2007/0229191 A1* | 10/2007 | Yamaki et al. ................ 333/193 |
| 2008/0191812 A1 | 8/2008 | Uejima et al. |

FOREIGN PATENT DOCUMENTS

| JP | 2000-151350 | * | 5/2000 |
| JP | 2003-179464 A | | 6/2003 |
| JP | 2004-95633 A | | 3/2004 |
| JP | 2004-165633 A | | 6/2004 |
| JP | 2005-294891 A | | 10/2005 |
| JP | 2007-266840 A | | 10/2007 |
| JP | 2007-274471 A | | 10/2007 |
| JP | 2008-67413 | * | 3/2008 |
| WO | 2007/088732 A1 | | 8/2007 |

OTHER PUBLICATIONS

Official Communication issued in International Patent Application No. PCT/JP2011/053942, mailed on May 10, 2011.

* cited by examiner

*Primary Examiner* — Barbara Summons
(74) *Attorney, Agent, or Firm* — Keating & Bennett, LLP

(57) ABSTRACT

A dual-band surface acoustic wave filter is mounted on a circuit board together with a high-frequency switch, constitutes a composite high-frequency component together with the high-frequency switch, and significantly reduces and prevents deterioration of filter characteristics of the composite high-frequency component. A first input terminal is located on a first corner portion of a second principal surface of a wiring board. A second input terminal is located on the second principal surface of the wiring board and along a first long side or a first short side so as to be next to the first input terminal. First and second output terminals are arranged on an edge portion of the second principal surface of the wiring board on a second long side and along the second long side.

16 Claims, 8 Drawing Sheets

DUAL-BAND SURFACE ACOUSTIC WAVE FILTER AND COMPOSITE HIGH-FREQUENCY COMPONENT

BACKGROUND OF THE INVENTION

1. Field of the Invention

The present invention relates to a dual-band surface acoustic wave filter and a composite high-frequency component. Particularly, the present invention relates to a dual-band surface acoustic wave filter preferably for use in a composite high-frequency component including a high-frequency switch, and a composite high-frequency component including such a dual-band surface acoustic wave filter.

2. Description of the Related Art

In recent years, cellular phones supporting a plurality of communication methods having different frequency bands have been popularized. In such a cellular phone, in order to transmit and receive transmission and reception signals in the plurality of communication methods using a single antenna, a switch module capable of switching among a plurality of transmission and reception signals is used.

For example, Japanese Unexamined Patent Application Publication No. 2007-266840 described below describes a switch module 100 shown in FIG. 11, as an example of such a switch module.

As shown in FIG. 11, the switch module 100 includes a circuit board 101 composed of a plurality of laminated dielectric layers. On a front surface of the circuit board 101, a high-frequency switch 102, a plurality of surface acoustic wave filters 103a to 103c, a plurality of chip capacitors 104a to 104d, and a chip inductor 104e are mounted. It should be noted that among the plurality of surface acoustic wave filters 103a to 103c, each of the surface acoustic wave filters 103a and 103c is a single-band surface acoustic wave filter including one surface acoustic wave filter portion. Meanwhile, the surface acoustic wave filter 103b is a dual-band surface acoustic wave filter including two surface acoustic wave filter portions.

Although not shown, each of output terminals of the surface acoustic wave filters 103a to 103c is connected via a via-hole electrode continuous in a lamination direction of the circuit board 101, to an external terminal formed on a back surface of the circuit board 101. Thus, the external terminals of the circuit board 101 are located almost directly below the output terminals of the surface acoustic wave filters 103a to 103c, respectively, and hence an output side wiring that connects each output terminal to each external terminal is shortened and two output side wirings next to each other do not overlap each other in the lamination direction and are not close to each other. Therefore, a parasitic impedance and a parasitic capacitance are unlikely to occur.

Further, in this case, near an edge portion of the back surface of the circuit board 101 on an X1 side in an x direction, a plurality of external terminals can be arranged along a y direction perpendicular to the x direction. Thus, wirings that connect the external terminals of the circuit board 101 to an RF-IC in which a part of an RF circuit at a stage subsequent to the switch module 100 is integrated can be shortened.

However, in the switch module 100 shown in FIG. 11, on the front surface of the circuit board 101, the plurality of surface acoustic wave filters 103a to 103c are arranged near the edge portion on the x1 side and along the y direction, and the high-frequency switch 102 is arranged near a center of an edge portion on an x2 side. Thus, the length dimension, in the y direction, of the space in which the plurality of surface acoustic wave filters 103a to 103c are arranged tends to be larger than the length dimension, in the y direction, of the high-frequency switch 102. Therefore, there is a problem that dead spaces occur on both sides of the high-frequency switch 102 in the y direction and the switch module 100 is increased in size.

Thus, for example, it is also considered that as shown in FIG. 12, two single-band surface acoustic wave filters 103a and 103b and two single-band surface acoustic wave filters 103c and 103d are arranged on both sides, respectively, of the high-frequency switch 102 in the y direction. In this case, a dead space on the circuit board 101 can be smaller than that when the surface acoustic wave filters 103a to 103d are arranged linearly. Thus, the switch module can be reduced in size.

In the switch module shown in FIG. 12, unbalanced input terminals 105a to 105d of the surface acoustic wave filters 103a to 103d are connected to the high-frequency switch 102. Thus, as shown in FIG. 12, the unbalanced input terminals 105a to 105d are preferably arranged near the high-frequency switch 102. When so configured, first and second balanced output terminals 106a to 106d and 107a to 107d of the surface acoustic wave filters 103a to 103d are arranged on the opposite sides of the surface acoustic wave filters 103a to 103d in the y direction with respect to the high-frequency switch 102.

Here, when external terminals are provided directly below the output terminals of the surface acoustic wave filters 103a to 103d similarly to the case shown in FIG. 11, a plurality of the external terminals are separately arranged near a y1-side short side and a y2-side short side of the circuit board 101 in the case shown in FIG. 12. Thus, at least either of the wirings drawn from the y1-side external terminals and the wirings drawn from the y2 side bypass and are connected to the RF-IC. As a result, the wirings are longer than existing ones, and hence the area of the board on which the high-frequency switch 102 and the RF-IC are mounted increases.

Thus, in the case shown in FIG. 12, it is necessary to arrange a plurality of external terminals 108a to 108h near the edge portion of the circuit board 101 on the x1 side and along the y direction and to electrically connect these external terminals 108a to 108h to the first and second balanced output terminals 106a to 106d and 107a to 107d of the surface acoustic wave filters 103a to 103d via wirings formed on the front surface of the circuit board 101 and within the circuit board 101.

However, as a result of an experiment, the inventor of the present invention has discovered that the filter characteristics of the surface acoustic wave filters of the switch module deteriorate when the arrangement configuration as shown in FIG. 12 is used. In other words, when the arrangement configuration as shown in FIG. 12 is used, output side wirings 110a to 110h that electrically connect the plurality of external terminals 108a to 108h to the first and second balanced output terminals 106a to 106d and 107a to 107d, and input side wirings 111a to 111d that electrically connect the high-frequency switch 102 to the unbalanced input terminal 105a to 105d, intersect each other in a lamination direction of the circuit board 101 and are close to each other as shown in FIG. 13. As a result, it was discovered that parasitic components occur between the output side wirings 110a to 110h and the input side wirings 111a to 111d and thus isolation between input and output and balance of a balanced output signal deteriorate.

SUMMARY OF THE INVENTION

In view of such discoveries, preferred embodiments of the present invention provide a dual-band surface acoustic wave filter that is mounted on a circuit board together with a high-frequency switch, that constitutes a composite high-frequency component together with the high-frequency switch, and that significantly reduces and prevents deterioration of filter characteristics of the composite high-frequency component, and a composite high-frequency component including the same.

A dual-band surface acoustic wave filter according to a preferred embodiment of the present invention includes a wiring board, a first surface acoustic wave chip, and a second surface acoustic wave chip. The wiring board includes first and second long sides, first and second short sides, a first corner portion defined by the first long side and the first short side, a second corner portion defined by the second long side and the second short side, and first and second principal surfaces. The first surface acoustic wave chip is mounted on the first principal surface of the wiring board. The first surface acoustic wave chip includes a first piezoelectric substrate and a first surface acoustic wave filter portion that is provided on the first piezoelectric substrate. The second surface acoustic wave chip is mounted on the first principal surface of the wiring board. The second surface acoustic wave chip includes a second piezoelectric substrate and a second surface acoustic wave filter portion that is provided on the second piezoelectric substrate. The second surface acoustic wave filter portion has a band different from that of the first surface acoustic wave filter portion. The first surface acoustic wave filter portion includes a first input pad electrode and a first output pad electrode. The second surface acoustic wave filter portion includes a second input pad electrode and a second output pad electrode. A first input terminal, a second input terminal, a first output terminal, and a second output terminal are provided on the second principal surface of the wiring board. The first input terminal is electrically connected to the first input pad electrode. The second input terminal is electrically connected to the second input pad electrode. The first output terminal is electrically connected to the first output pad electrode. The second output terminal is electrically connected to the second output pad electrode. The first input terminal is located on the first corner portion of the second principal surface of the wiring board. The second input terminal is located on the second principal surface of the wiring board and along the first long side or the first short side so as to be next to the first input terminal. The first and second output terminals are arranged on an edge portion on a second-long-side side of the second principal surface of the wiring board and along the second long side.

According to a specific aspect of the dual-band surface acoustic wave filter according to a preferred embodiment of the present invention, the first piezoelectric substrate and the second piezoelectric substrate preferably are integral with each other. According to this configuration, the dual-band surface acoustic wave filter can be reduced in size further.

According to another specific aspect of the dual-band surface acoustic wave filter according to a preferred embodiment of the present invention, each of the first and second surface acoustic wave filter portions has a balance-unbalance conversion function, and the two first output terminals and the two second output terminals are provided.

According to still another specific aspect of the dual-band surface acoustic wave filter according to a preferred embodiment of the present invention, each first output terminal preferably is integral with each second output terminal.

A composite high-frequency component according to another preferred embodiment of the present invention includes the above dual-band surface acoustic wave filter according to a preferred embodiment of the present invention, a high-frequency switch, and a circuit board. The circuit board includes a first principal surface on which the dual-band surface acoustic wave filter and the high-frequency switch are mounted, and a second principal surface facing the first principal surface. The dual-band surface acoustic wave filter is arranged such that a long side of the first principal surface of the circuit board faces the second short side of the dual-band surface acoustic wave filter; and a short side of the first principal surface of the circuit board faces the second long side of the dual-band surface acoustic wave filter. The high-frequency switch is arranged on the first principal surface of the circuit board so as to face the first long side of the dual-band surface acoustic wave filter. A plurality of external terminals are located on the second principal surface of the circuit board so as to be arranged on an edge portion on a side ipsilateral to the long side of the first principal surface of the circuit board and along the long side, and so as to be electrically connected to the first and second output terminals. An input side wiring that electrically connects the first and second input terminals to the high-frequency switch and a plurality of output side wirings that electrically connect the plurality of external terminals to the first and second output terminals are provided in the circuit board.

According to a specific aspect of the composite high-frequency component according to a preferred embodiment of the present invention, the composite high-frequency component includes another dual-band surface acoustic wave filter. The other dual-band surface acoustic wave filter is arranged on the first principal surface of the circuit board such that the first long side thereof faces the high-frequency switch, the second short side thereof faces a long side of the first principal surface of the circuit board, and the second long side thereof faces another short side of the first principal surface of the circuit board. Another plurality of external terminals are arranged on the second principal surface of the circuit board so as to be arranged on an edge portion on a side ipsilateral to the long side of the first principal surface of the circuit board and along the long side with the plurality of external terminals, and so as to be electrically connected to first and second output terminals of the other dual-band surface acoustic wave filter. Another input side wiring that electrically connects first and second input terminals of the other dual-band surface acoustic wave filter to the high-frequency switch and another plurality of output side wirings that electrically connect the other plurality of external terminals to the first and second output terminals of the other dual-band surface acoustic wave filter are provided in the circuit board.

According to various preferred embodiments of the present invention, a dual-band surface acoustic wave filter that is mounted on a circuit board together with a high-frequency switch, that constitutes a composite high-frequency component together with the high-frequency switch, and that can significantly decrease and prevent deterioration of filter characteristics of the composite high-frequency component, and a composite high-frequency component including the same can be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
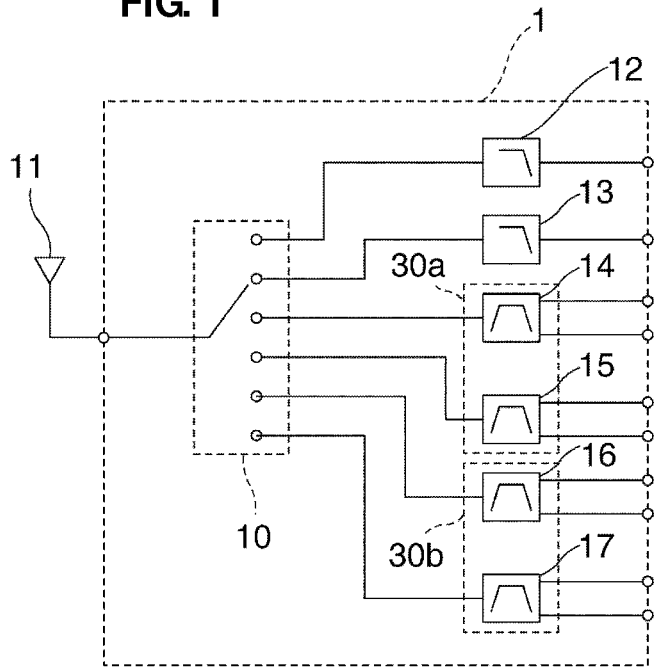
FIG. 1 is an equivalent circuit diagram of a composite high-frequency component according to a first preferred embodiment of the present invention.
Figure 2:
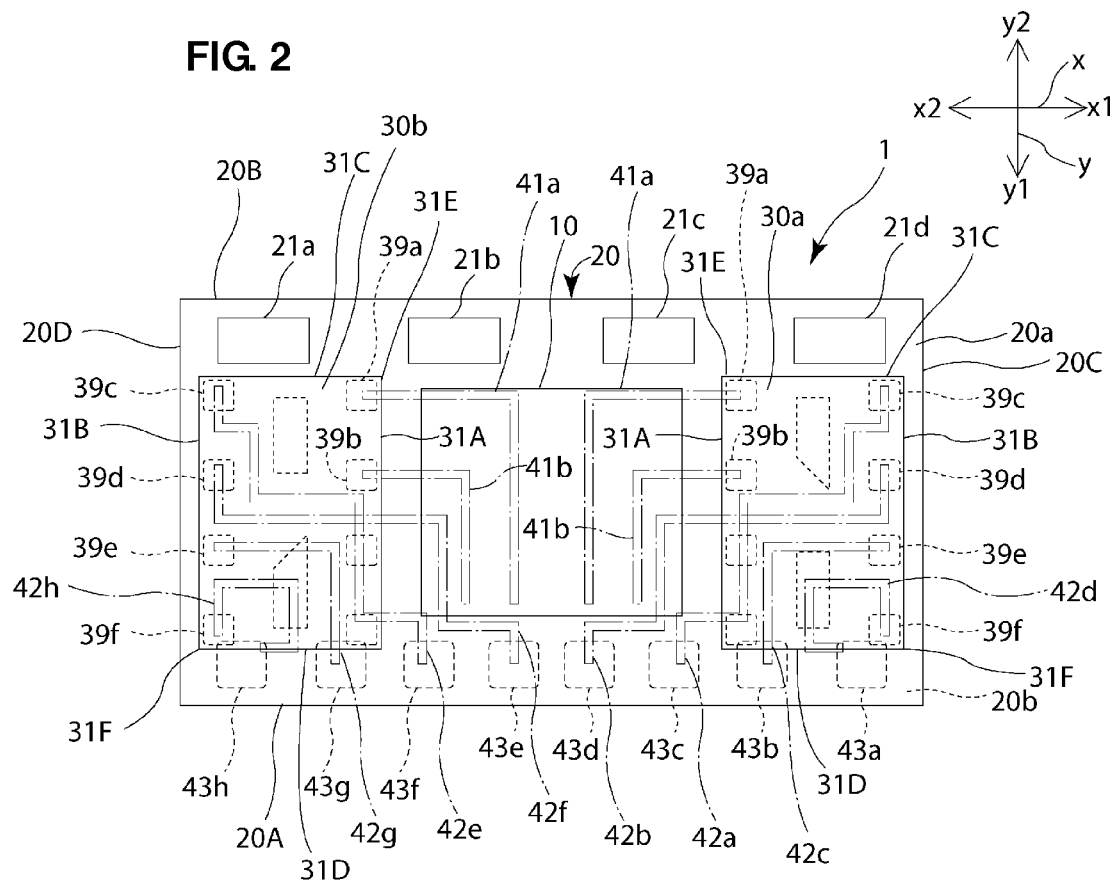
FIG. 2 is a schematic perspective plan view of the composite high-frequency component according to the first preferred embodiment of the present invention.

Hereinafter, preferred embodiments implementing the present invention will be described with a composite high-frequency component 1 shown in FIGS. 1 and 2 as an example. However, the composite high-frequency component 1 shown in FIGS. 1 and 2 is merely illustrative and exemplary. A composite high-frequency component according to the present invention is not limited to the composite high-frequency component 1.

The composite high-frequency component 1 of the present preferred embodiment preferably supports four communication methods, GSM 1800, GSM 1900, GSM 850, and GSM 900. In the composite high-frequency component 1, it is possible to switch among transmission and reception signals in the above four communication methods by a high-frequency switch 10.

Specifically, as shown in FIG. 1, the composite high-frequency component 1 includes the high-frequency switch 10 electrically connected to an antenna terminal 11, and six filter portions 12 to 17 electrically connected to the antenna terminal 11 via the high-frequency switch 10. The first filter portion 12 serves as a transmission side filter (Tx) portion for GSM 1800 and GSM 1900. The second filter portion 13 serves as a transmission side filter (Tx) portion for GSM 850 and GSM 900. The third filter portion 14 serves as a reception side filter (Rx) portion for GSM 1800. The fourth filter portion 15 serves as a reception side filter (Rx) portion for GSM 1900. The fifth filter portion 16 serves as a reception side filter (Rx) portion for GSM 850. The sixth filter portion 17 serves as a reception side filter (Rx) portion for GSM 900.

The high-frequency switch 10 is a switch that selectively connects at least one of the first to sixth filter portions 12 to 17 to the antenna terminal 11. The high-frequency switch 10 can be, for example, a GaAs switch.

It should be noted that as shown in FIG. 1, the first and second filter portions 12 and 13 have functions as low-pass filters. Meanwhile, the third to sixth filter portions 14 to 17 have functions as band-pass filters. In addition, the third to sixth filter portions 14 to 17 are filter portions having balance-unbalance conversion functions.

As shown in FIG. 2, the composite high-frequency component 1 includes a rectangular or substantially rectangular circuit board 20 including a plurality of laminated dielectric layers. The circuit board 20 includes first and second long sides 20A and 20B extending along a first direction x and first and second short sides 20C and 20D extending along a second direction y perpendicular to the first direction x. In addition, the circuit board 20 includes a first principal surface (front surface) 20a and a second principal surface (back surface) 20b facing the first principal surface 20a. On the first principal surface 20a of the circuit board 20, the high-frequency switch 10, two dual-band surface acoustic wave filters 30a and 30b, and other chip components 21a to 21d are mounted.

Each of the dual-band surface acoustic wave filters 30a and 30b is a dual-band type surface acoustic wave filter including two surface acoustic wave filter portions having pass bands different from each other. Specifically, the dual-band surface acoustic wave filter 30a includes the third filter portion 14 and the fourth filter portion 15 shown in FIG. 1. Meanwhile, the dual-band surface acoustic wave filter 30b includes the fifth filter portion 16 and the sixth filter portion 17.

These dual-band surface acoustic wave filters 30a and 30b have generally the same configurations except details such as configurations of IDT electrodes. Thus, the specific configurations of the dual-band surface acoustic wave filters 30a and 30b will be described with reference to FIG. 3, which is a schematic cross-sectional view of the dual-band surface acoustic wave filter 30a, and FIGS. 4 to 6.

Figure 3:
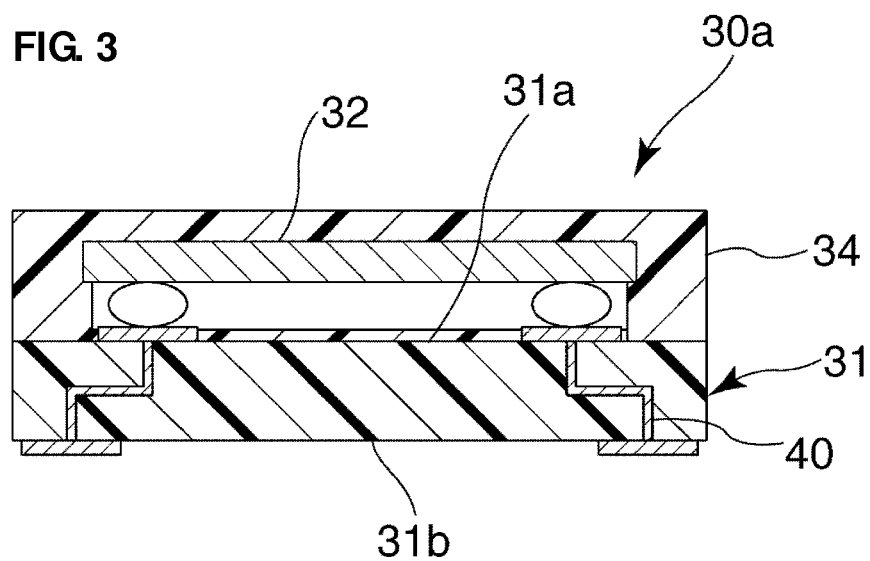
FIG. 3 is a schematic cross-sectional view of a dual-band surface acoustic wave filter in the first preferred embodiment of the present invention.
Figure 4:
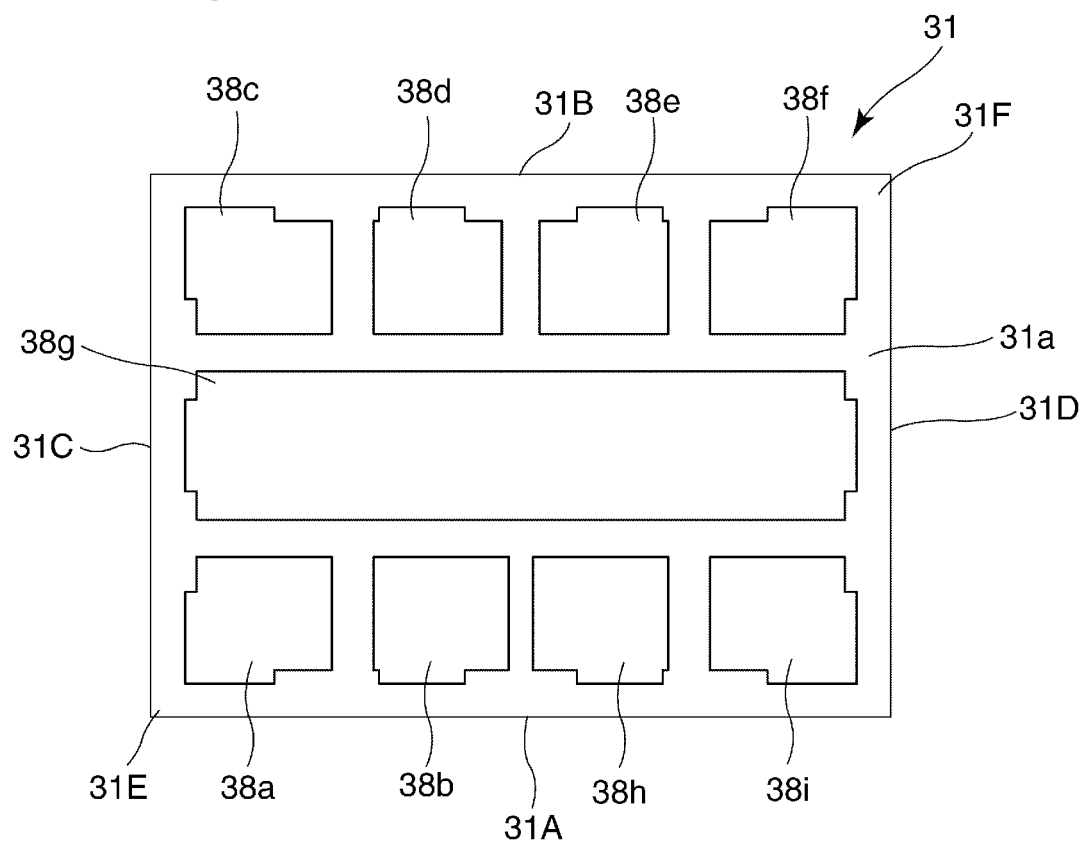
FIG. 4 is a schematic plan view of a front surface of a wiring board in the first preferred embodiment of the present invention.
Figure 5:
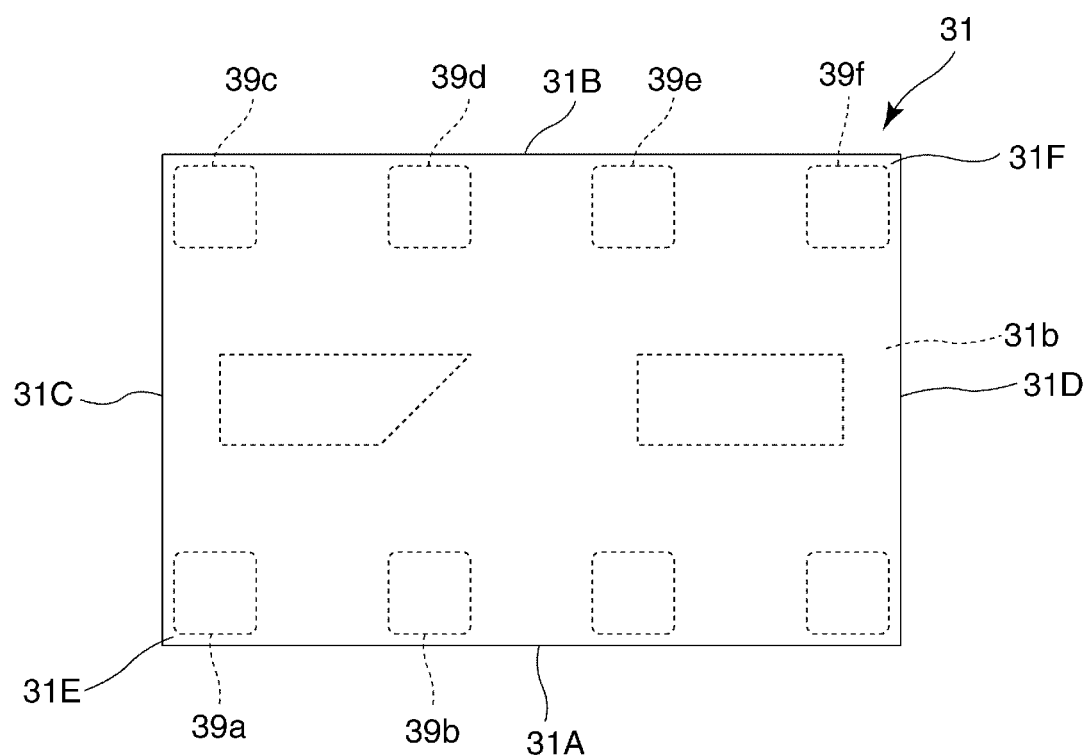
FIG. 5 is a schematic perspective view of a back surface of the wiring board in the first preferred embodiment of the present invention.

As shown in FIGS. 3 to 5, the dual-band surface acoustic wave filter 30a includes a rectangular or substantially rectangular wiring board 31 including a plurality of laminated dielectric layers. As shown in FIGS. 4 and 5, the dual-band surface acoustic wave filter 30a includes first and second long sides 31A and 31B, first and second short sides 31C and 31D, a first corner portion 31E defined by the first long side 31A and the first short side 31C, and a second corner portion 31F defined by the second long side 31B and the second short side 31D. In addition, as shown in FIGS. 3 to 5, the wiring board 31 includes a first principal surface (front surface) 31a and a second principal surface (back surface) 31b facing the first principal surface 31a.

As shown in FIG. 3, a surface acoustic wave chip 32 is flip-chip bonded on the first principal surface 31a of the wiring board 31 and sealed by a resin package 34. The surface acoustic wave chip 32 is a chip in which a first surface acoustic wave chip having the third filter portion 14 shown in FIG. 1 and a second surface acoustic wave chip including the fourth filter portion 15 preferably are integral with each other.

Figure 6:
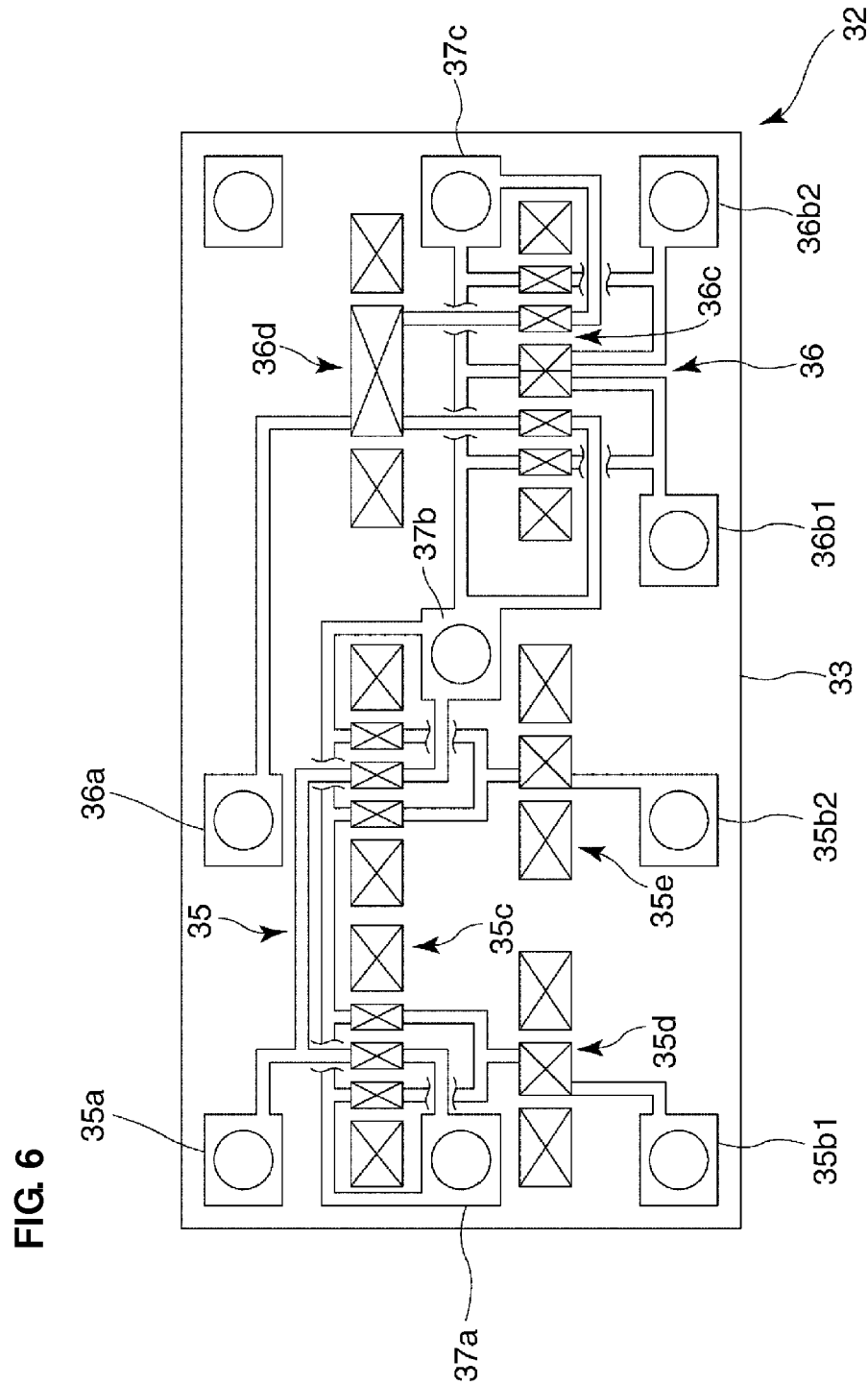
FIG. 6 is a schematic plan view of a back surface of a surface acoustic wave chip in the first preferred embodiment of the present invention.

As shown in FIG. 6, the surface acoustic wave chip 32 includes a piezoelectric substrate 33 in which a piezoelectric substrate of the first surface acoustic wave chip and a piezoelectric substrate of the second surface acoustic wave chip preferably are integral with each other. The piezoelectric substrate 33 can be made of an appropriate piezoelectric material. The piezoelectric substrate 33 can be made of LiNbO$_3$, LiTaO$_3$, crystal, or other suitable material, for example.

It should be noted that the first surface acoustic wave chip and the second surface acoustic wave chip may be separately provided by separately providing the piezoelectric substrates thereof.

On the piezoelectric substrate 33, a first surface acoustic wave filter portion 35 constituting the third filter portion 14 and a second surface acoustic wave filter portion 36 constituting the fourth filter portion 15 are provided. The second surface acoustic wave filter portion 36 has a pass band different from that of the first surface acoustic wave filter portion 35. In other words, in the present preferred embodiment, the reception frequency band of the second surface acoustic wave filter portion 36 is different from the reception frequency band of the first surface acoustic wave filter portion 35.

The first surface acoustic wave filter portion 35 is a so-called balance type surface acoustic wave filter portion having a balance-unbalance conversion function. The first surface acoustic wave filter portion 35 includes a first input pad electrode 35a and two first output pad electrodes 35b1 and 35b2. A longitudinally-coupled resonator type surface acoustic wave element 35c is electrically connected between the first input pad electrode 35a and the two first output pad electrodes 35b1 and 35b2. A surface acoustic wave resonator 35d is electrically connected between the longitudinally-coupled resonator type surface acoustic wave element 35c and the first output pad electrode 35b1. A surface acoustic wave resonator 35e is electrically connected between the longitudinally-coupled resonator type surface acoustic wave element 35c and the first output pad electrode 35b2.

Similarly to the first surface acoustic wave filter portion 35, the second surface acoustic wave filter portion 36 is also a so-called balance-type surface acoustic wave filter portion having a balance-unbalance conversion function. The second surface acoustic wave filter portion 36 includes a second input pad electrode 36a and two second output pad electrodes 36b1 and 36b2. A longitudinally-coupled resonator type surface acoustic wave element 36c is electrically connected between the second input pad electrode 36a and the two second output pad electrodes 36b1 and 36b2. A surface acoustic wave resonator 36d is electrically connected between the longitudinally-coupled resonator type surface acoustic wave element 36c and the second input pad electrode 36a.

Further, on the piezoelectric substrate 33, ground pad electrodes 37a to 37c are provided.

The first and second input pad electrodes 35a and 36a and the first and second output pad electrodes 35b1, 35b2, 36b1, and 36b2 are electrically connected to electrodes 38a to 38f provided on the first principal surface 31a of the wiring board 31 as shown in FIG. 4, via bumps. Specifically, the first input pad electrode 35a is electrically connected to the electrode 38a. The second input pad electrode 36a is electrically connected to the electrode 38b. The first output pad electrode 35b1 is electrically connected to the electrode 38c. The first output pad electrode 35b2 is electrically connected to the electrode 38d. The second output pad electrode 36b1 is electrically connected to the electrode 38e. The second output pad electrode 36b2 is electrically connected to the electrode 38f. The ground pad electrodes 37a to 37c are electrically connected to an electrode 38g electrically connected to a ground potential, via bumps. It should be noted that other electrodes 38h and 38i are dummy electrodes.

The electrode 38a to 38f are electrically connected via wirings 40 located within the wiring board 31 and schematically shown in FIG. 3, to input and output terminals 39a to 39f located on the second principal surface (back surface) 31b of the wiring board 31 as shown in FIG. 5. Specifically, the electrode 38a electrically connected to the first input pad electrode 35a is electrically connected to the first input terminal 39a. The electrode 38b electrically connected to the second input pad electrode 36a is electrically connect to the second input terminal 39b. The electrode 38c electrically connected to the first output pad electrode 35b1 is electrically connected to the first output terminal 39c. The electrode 38d electrically connected to the first output pad electrode 35b2 is connected to the first output terminal 39d. The electrode 38e electrically connected to the second output pad electrode 36b1 is connected to the second output terminal 39e. The electrode 38f electrically connected to the second output pad electrode 36b2 is connected to the second output terminal 39f.

As shown in FIG. 5, the first input terminal 39a is located on the first corner portion 31E of the second principal surface 31b of the wiring board 31. The first input terminal 39a faces the first long side 31A and the first short side 31C. The second input terminal 39b is located on the second principal surface 31b of the wiring board 31 and along the first long side 31A so as to be next to the first input terminal 39a. In other words, the first and second input terminals 39a and 39b are arranged on the first corner portion 31E side of the edge portion on the first long side 31A side. Meanwhile, the first and second output terminals 39c to 39f are arranged on the edge portion of the second principal surface 31b of the wiring board 31 on the second long side 31B side and at equal intervals along the second long side 31B. FIG. 5 is a perspective plan view illustrating the first and second input terminals 39a and 39b and the first and second output terminals 39c to 39f when seen through from the first principal surface 31a side of the wiring board 31. In addition, each of terminals other than the input and output terminals 39a to 39f in FIG. 5 is a ground terminal or a dummy terminal.

Next, a mode in which the high-frequency switch 10 and the two dual-band surface acoustic wave filters 30a and 30b are mounted on the first principal surface (front surface) 20a of the circuit board 20 will be described mainly with reference to FIG. 2.

As shown in FIG. 2, the high-frequency switch 10 and the two dual-band surface acoustic wave filters 30a and 30b are arranged along the first direction x that is a direction in which the first and second long sides 20A and 20B of the circuit board 20 extend. Among the high-frequency switch 10 and the two dual-band surface acoustic wave filters 30a and 30b, the high-frequency switch 10 is located at the center in the first direction x. The dual-band surface acoustic wave filter 30a is located on the x1 side in the first direction x with respect to the high-frequency switch 10. Meanwhile, the dual-band surface acoustic wave filter 30b is located on the x2 side in the first direction x with respect to the high-frequency switch 10.

The dual-band surface acoustic wave filter 30a is arranged such that the first long side 20A of the first principal surface 20a of the circuit board 20 faces the second short side 31D of the dual-band surface acoustic wave filter 30a; and the first short side 20C of the first principal surface 20a of the circuit board 20 faces the second long side 31B of the dual-band surface acoustic wave filter 30a.

The dual-band surface acoustic wave filter 30b is arranged such that the first long side 20A of the first principal surface 20a of the circuit board 20 faces the second short side 31D of the dual-band surface acoustic wave filter 30b; and the second short side 20D of the first principal surface 20a of the circuit board 20 faces the second long side 31B of the dual-band surface acoustic wave filter 30b. It should be noted that the dual-band surface acoustic wave filter 30b is configured such that the first and second input terminals 39a and 39b and the first and second output terminals 39c to 39f are arranged to be mirror-symmetrical to the dual-band surface acoustic wave filter 30a.

The high-frequency switch 10 preferably has a rectangular or substantially rectangular shape and is arranged on the first principal surface 20a of the circuit board 20 so as to face the first long sides 31A of the dual-band surface acoustic wave filters 30a and 30b. Thus, the first and second input terminals 39a and 39b of the dual-band surface acoustic wave filters 30a and 30b are located adjacent to the high-frequency switch 10. The first and second input terminals 39a and 39b are electrically connected to the high-frequency switch 10 via input side wirings 41a and 41b and via-hole electrodes which are provided within the circuit board 20.

Meanwhile, the first and second output terminals 39c to 39f are electrically connected to a plurality of external terminals 43a to 43h located on the second principal surface (back surface) 20b of the circuit board 20. These external terminals 43a to 43h are arranged on an edge portion of the second principal surface 20b of the circuit board 20 on the first long side 20A side and along the first long side 20A.

Specifically, in the present preferred embodiment, the first output terminal 39c of the dual-band surface acoustic wave filter 30a is electrically connected to the external terminal 43c via an output side wiring 42a and a via-hole electrode which are located within the circuit board 20. The first output terminal 39d of the dual-band surface acoustic wave filter 30a is electrically connected to the external terminal 43d via an output side wiring 42b and a via-hole electrode which are located within the circuit board 20. The second output terminal 39e of the dual-band surface acoustic wave filter 30a is electrically connected to the external terminal 43b via an output side wiring 42c and a via-hole electrode which are located within the circuit board 20. The second output terminal 39f of the dual-band surface acoustic wave filter 30a is electrically connected to the external terminal 43a via an output side wiring 42d and a via-hole electrode which are located within the circuit board 20.

Further, the first output terminal 39c of the dual-band surface acoustic wave filter 30b is electrically connected to the external terminal 43f via an output side wiring 42e and a via-hole electrode which are located within the circuit board 20. The first output terminal 39d of the dual-band surface acoustic wave filter 30b is electrically connected to the external terminal 43e via an output side wiring 42f and a via-hole electrode which are located within the circuit board 20. The second output terminal 39e of the dual-band surface acoustic wave filter 30b is electrically connected to the external terminal 43g via an output side wiring 42g and a via-hole electrode which are located within the circuit board 20. The second output terminal 39f of the dual-band surface acoustic wave filter 30b is electrically connected to the external terminal 43h via an output side wiring 42h and a via-hole electrode which are located within the circuit board 20.

It should be noted that the chip components 21a to 21b are arranged on an edge portion of the first principal surface 20a of the circuit board 20 on the y2 side in the second direction y with respect to the high-frequency switch 10 and the dual-band surface acoustic wave filters 30a and 30b and along the first direction x.

Each of the first and second filter portions 12 and 13 preferably includes an LC resonant circuit composed of a wiring pattern that is located within the circuit board 20 and not shown.

As described above, in the present preferred embodiment, the first input terminal 39a is located on the first corner portion 31E. The second input terminal 39b is arranged along the first long side 31A so as to be next to the first input terminal 39a. The first and second output terminals 39c to 39f are arranged on the edge portion on the second long side 31B side and along the second long side 31B. Thus, even when the external terminals 43a to 43h of the composite high-frequency component 1 are arranged on the edge portion on the first long side 20A side in order to cause a wiring, which connects the composite high-frequency component 1 to an RF-IC at a subsequent stage, to be the shortest, it can effectively be suppressed that the input side wirings 41a and 41b and the output side wirings 42a to 42h intersect each other in a lamination direction of the circuit board 20 and are close to each other. Thus, occurrence of an unwanted parasitic component can effectively be significantly reduced and prevented. Therefore, deterioration of filter characteristics such as isolation between input and output and balance of a balanced output signal can be significantly reduced and prevented.

Hereinafter, this effect will be described in more detail on the basis of a specific example.

Figure 7:
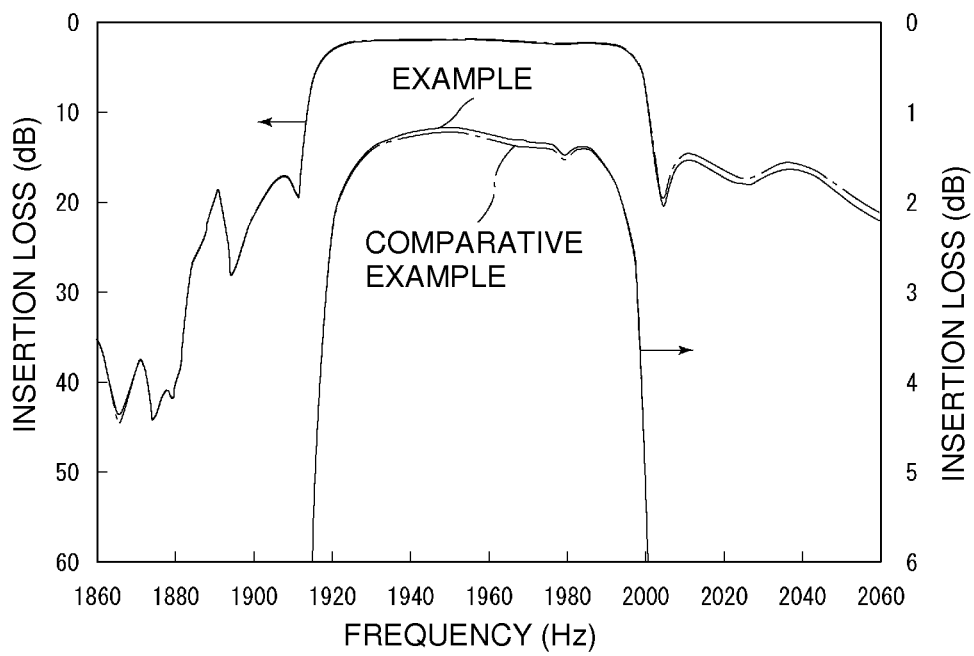
FIG. 7 is a graph showing the insertion loss of a fourth filter portion in a composite high-frequency component according to an example of a preferred embodiment of the present invention and the insertion loss of a fourth filter portion in a composite high-frequency component according to a comparative example.
Figure 8:
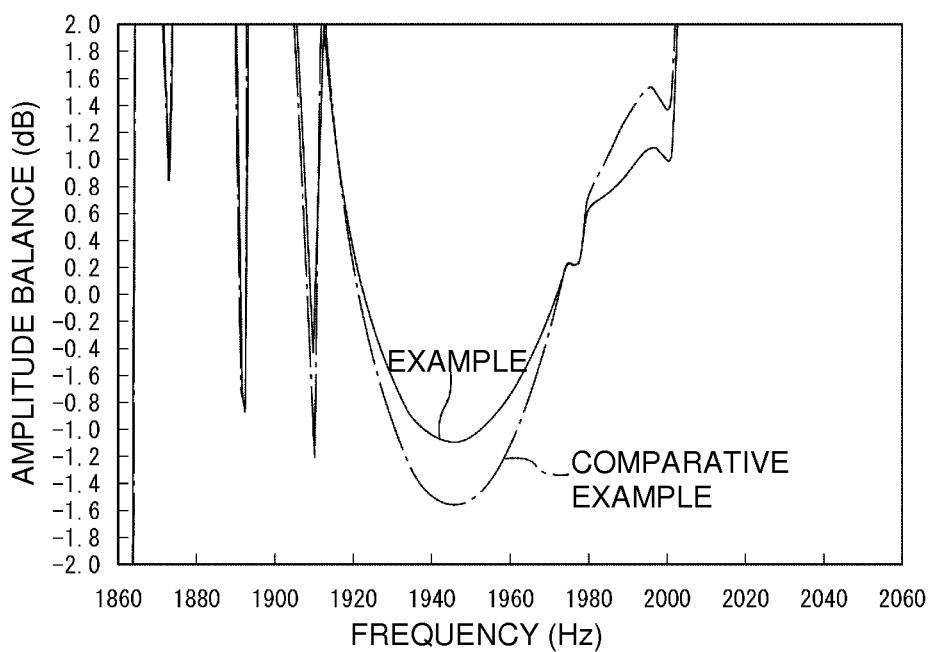
FIG. 8 is a graph showing the amplitude balance of the fourth filter portion in the composite high-frequency component according to the example of a preferred embodiment of the present invention and the amplitude balance of the fourth filter portion in the composite high-frequency component according to the comparative example.
Figure 9:
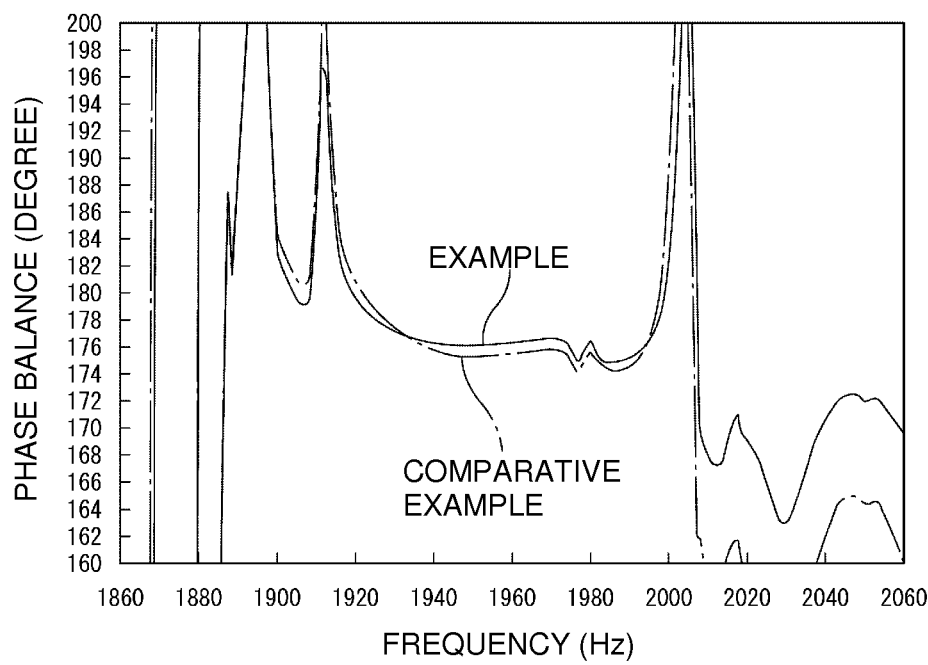
FIG. 9 is a graph showing the phase balance of the fourth filter portion in the composite high-frequency component according to the example of a preferred embodiment of the present invention and the phase balance of the fourth filter portion in the composite high-frequency component according to the comparative example.

FIG. 7 is a graph showing the insertion loss of a fourth filter portion in a composite high-frequency component according to an example of a preferred embodiment of the present invention and the insertion loss of a fourth filter portion in a composite high-frequency component according to a comparative example. FIG. 8 is a graph showing the amplitude balance of the fourth filter portion in the composite high-frequency component according to the example of a preferred embodiment of the present invention and the amplitude balance of the fourth filter portion in the composite high-frequency component according to the comparative example. FIG. 9 is a graph showing the phase balance of the fourth filter portion in the composite high-frequency component according to the example of a preferred embodiment of the present invention and the phase balance of the fourth filter portion in the composite high-frequency component according to the comparative example.

Figure 12:
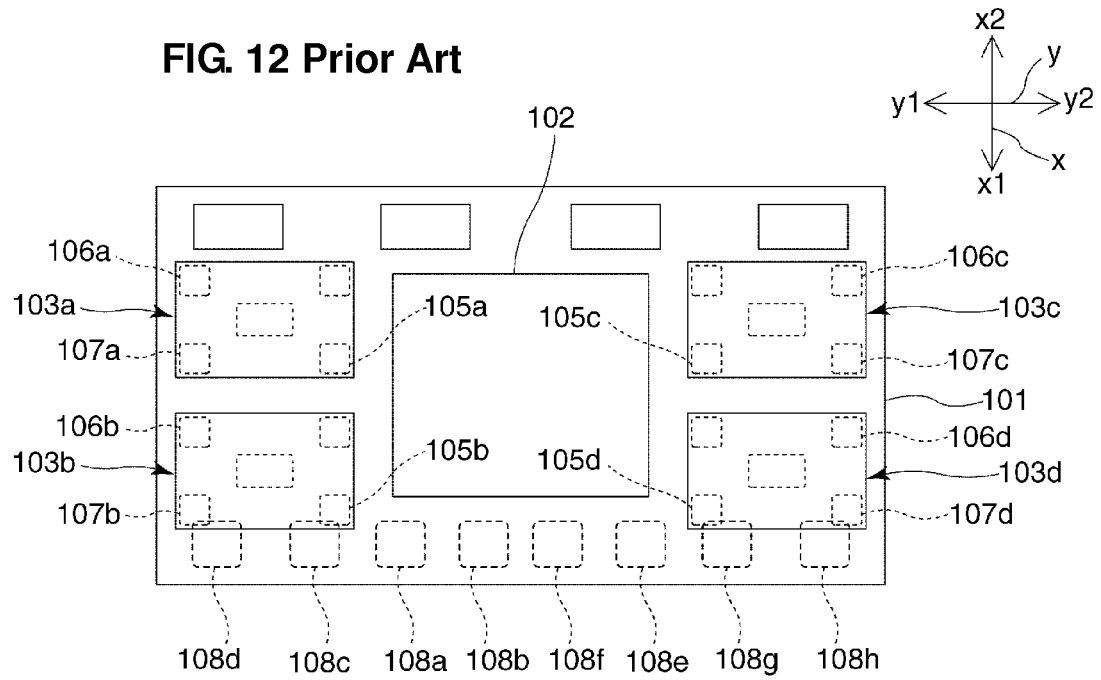
FIG. 12 is a schematic plan view of a switch module according to a reference example.
Figure 13:
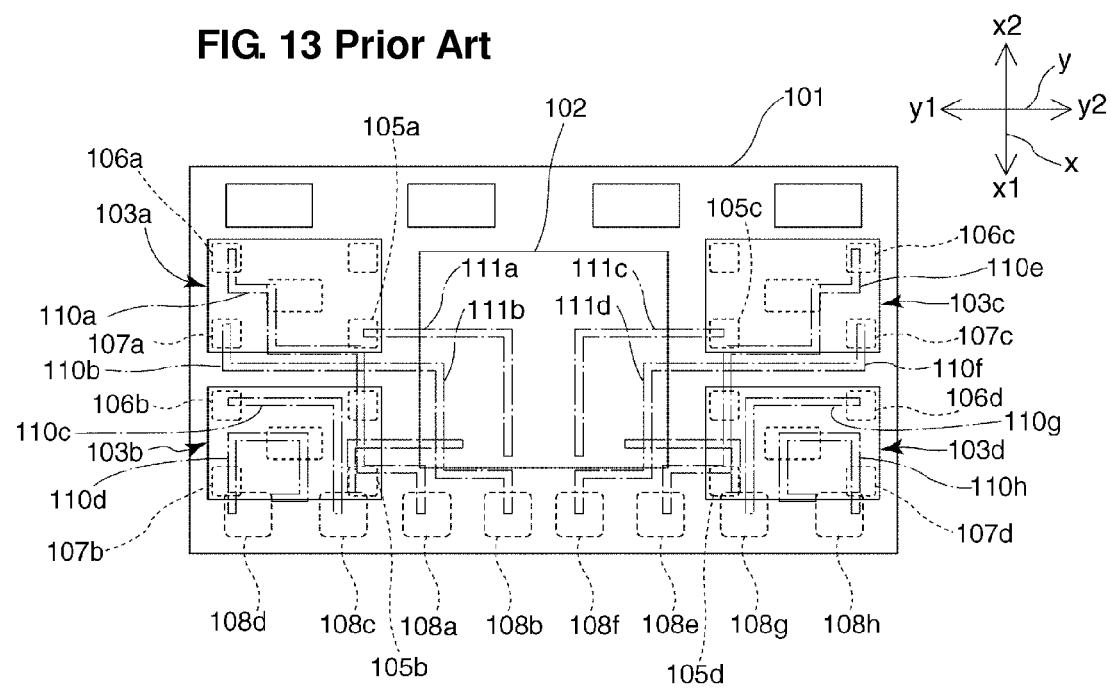
FIG. 13 is a schematic plan view for illustrating a mode of connection between output terminals of surface acoustic wave filters and terminal electrodes in the reference example.

The composite high-frequency component according to the example of a preferred embodiment of the present invention which is shown in FIGS. 7 to 9 preferably has the same configuration as that of the composite high-frequency component 1 according to the first preferred embodiment described above, and the composite high-frequency component according to the comparative example has the same configuration as that of the example except that the arrangement configuration of parts shown in FIG. 12 and the layout of the internal wirings of the circuit board shown in FIG. 13 are used. As shown in FIG. 7, isolation between input and output less deteriorates in the example in which the configuration of the first preferred embodiment is used, than in the comparative example. Thus, the insertion loss is low in the pass band, and an amount of attenuation is large in the outside of the pass band on the high frequency side. In addition, as shown in FIGS. 8 and 9, it appears that the balance of a balanced output signal is better in the example than in the comparative example. Due to the above, it appears that when the configuration of the first preferred embodiment described above is used, good filter characteristics are obtained.

Further, when the arrangement of the first and second input terminals 39a and 39b and the first and second output terminals 39c to 39f in the dual-band surface acoustic wave filters 30a and 30b of the first preferred embodiment is used, flexibility in arranging the input side wirings 41a and 41b and the output side wirings 42a to 42h of the circuit board 20 can be increased. Moreover, when the arrangement of the high-frequency switch 10 and the dual-band surface acoustic wave filters 30a and 30b on the circuit board 20 of the first preferred embodiment is used, the composite high-frequency component 1 can be reduced in size.

It should be noted that in the first preferred embodiment described above, the case has been described where the first and second input terminals 39a and 39b are preferably arranged along the first long side 31A. However, the present invention is not limited to this configuration. For example, the first and second input terminals 39a and 39b can be next to each other, and may be arranged along the first short side 31C of the wiring board 31.

Further, in the first preferred embodiment described above, the case has been described where in each of the dual-band surface acoustic wave filters 30a and 30b, all the first and second output terminals 39c to 39f are preferably arranged along the second long side 31B. However, the present invention is not limited to this configuration. In the present invention, it suffices that at least either one of the two first output terminals and at least either one of the two second output terminals in the dual-band surface acoustic wave filter are arranged on the second long side 31B side, and the other first output pad electrode or second output pad electrode may be arranged on the first short side 31C side or on the second short side 31D side.

Further, in the first preferred embodiment described above, the case has been described where the first and second surface acoustic wave filter portions of each dual-band surface acoustic wave filter preferably are a balance type and the four output terminals are provided in total. However, the present invention is not limited to this configuration. For example, the output terminals of the first surface acoustic wave filter portion may also be used as the output terminals of the second surface acoustic wave filter portion. In addition, the first and/or second surface acoustic wave filter portions may be an unbalance type which does not have a balance-unbalance conversion function. In these cases, two output terminals may be provided. For example, in an example shown in FIG. 10, two output terminals, namely, an output terminal 39x in which the first output terminal 39c and the second output terminal 39e preferably are integral with each other and an output terminal 39y in which the first output terminal 39d and the second output terminal 39f preferably are integral with each other, are provided. In the example shown in FIG. 10, preferably, the output terminals 39x and 39y are arranged on the second corner portion 31F, and the first and second input terminals 39a and 39b are arranged on the first corner portion 31E. In other words, the output terminals 39x and 39y and the first and second input terminals 39a and 39b are preferably arranged in a diagonal relation.

Figure 10:
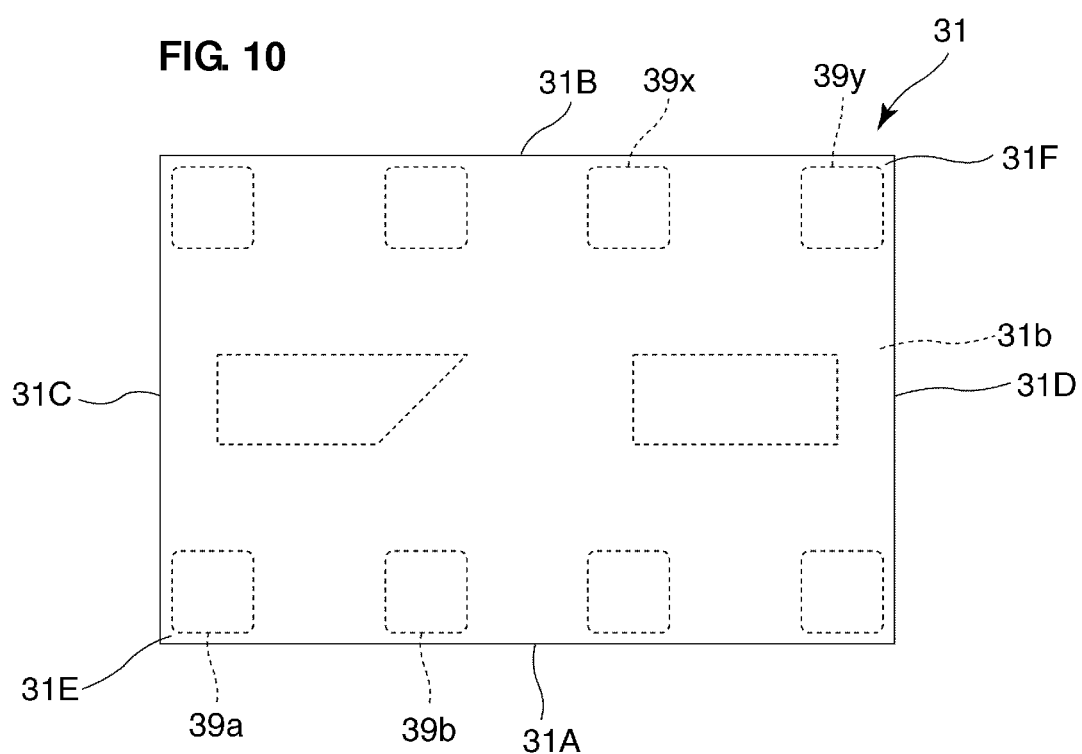
FIG. 10 is a schematic perspective view of a back surface of a wiring board in a modified example of a preferred embodiment of the present invention.
Figure 11:
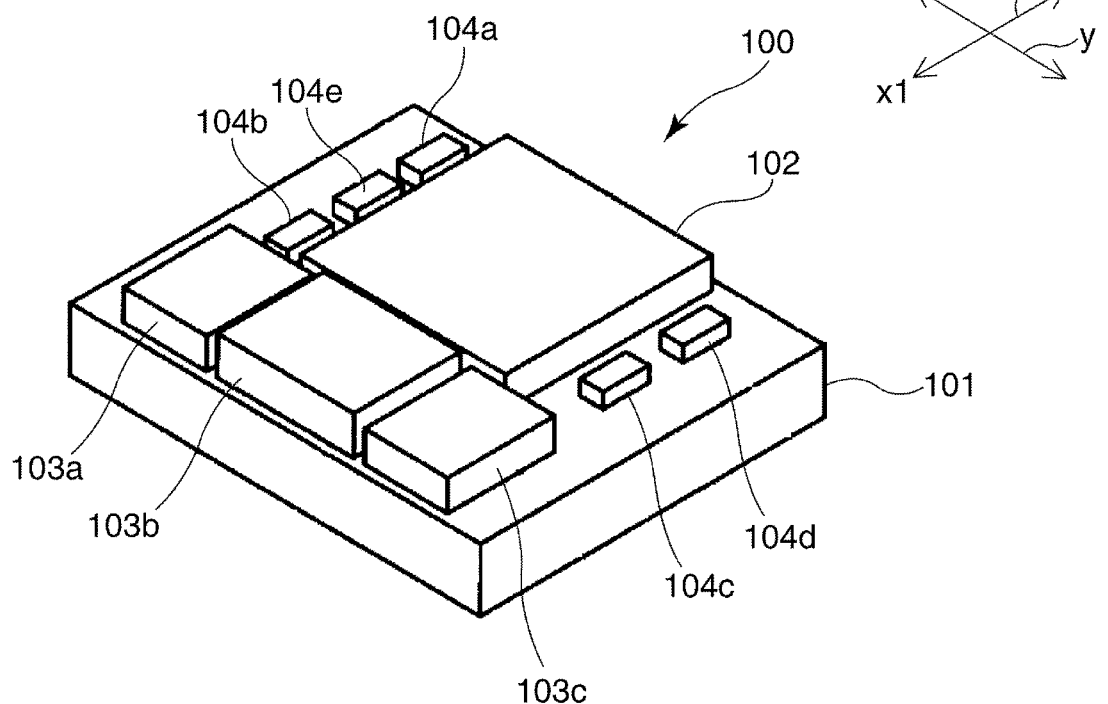
FIG. 11 is a schematic perspective view of the switch module described in Japanese Unexamined Patent Application Publication No. 2007-266840.

It should be noted that in the example shown in FIG. 10, the case has been described where the output terminals 39x and 39y and the first and second input terminals 39a and 39b preferably are arranged along the long sides, respectively, but the output terminals 39x and 39y and the first and second input terminals 39a and 39b may be arranged along the short sides, respectively.

When the output terminals 39x and 39y and the first and second input terminals 39a and 39b are arranged as described above, the flexibility in arranging the input side wirings 41a and 41b and the output side wirings 42a to 42h of the circuit board 20 can be increased further.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A dual-band surface acoustic wave filter comprising:
 a wiring board including first and second long sides, first and second short sides, a first corner portion defined by the first long side and the first short side, a second corner portion defined by the second long side and the second short side, and first and second principal surfaces;
 a first surface acoustic wave chip mounted on the first principal surface of the wiring board and including a first piezoelectric substrate and a first surface acoustic wave filter portion that is located on the first piezoelectric substrate; and
 a second surface acoustic wave chip mounted on the first principal surface of the wiring board and including a second piezoelectric substrate and a second surface acoustic wave filter portion that is located on the second piezoelectric substrate and has a band different from that of the first surface acoustic wave filter portion; wherein
 the first surface acoustic wave filter portion includes a first input pad electrode and a first output pad electrode;
 the second surface acoustic wave filter portion includes a second input pad electrode and a second output pad electrode;
 a first input terminal electrically connected to the first input pad electrode, a second input terminal electrically connected to the second input pad electrode, a first output terminal electrically connected to the first output pad electrode, and a second output terminal electrically connected to the second output pad electrode are located on the second principal surface of the wiring board;
 the first input terminal is located on the first corner portion of the second principal surface of the wiring board;
 the second input terminal is located on the second principal surface of the wiring board and along the first long side or the first short side so as to be next to the first input terminal; and
 the first and second output terminals are arranged on an edge portion on a second-long-side side of the second principal surface of the wiring board and along the second long side.

2. The dual-band surface acoustic wave filter according to claim 1, wherein the first piezoelectric substrate and the second piezoelectric substrate are integral with each other.

3. The dual-band surface acoustic wave filter according to claim 1, wherein each of the first and second surface acoustic wave filter portions has a balance-unbalance conversion function, and the two first output terminals and the two second output terminals are provided.

4. The dual-band surface acoustic wave filter according to claim 3, wherein each first output terminal is integral with each second output terminal.

5. The dual-band surface acoustic wave filter according to claim 1, wherein the wiring board is rectangular or substantially rectangular.

6. The dual-band surface acoustic wave filter according to claim 1, wherein the wiring board is rectangular or substantially rectangular and includes a plurality of laminated dielectric layers.

7. The dual-band surface acoustic wave filter according to claim 1, wherein the dual-band surface acoustic filter is operative in GSM 1800, GSM 1900, GSM 850 and GSM 900 communication systems.

8. The dual-band surface acoustic wave filter according to claim 7, further comprising a high-frequency switch that switches between the GSM 1800, GSM 1900, GSM 850 and GSM 900 communication systems.

9. The dual-band surface acoustic wave filter according to claim 1, further comprising third, fourth, fifth and sixth surface acoustic wave filter portions.

10. The dual-band surface acoustic wave filter according to claim 9, further comprising a high-frequency switch that switches between the first through sixth surface acoustic wave filter portions.

11. A composite high-frequency component comprising:
   a dual-band surface acoustic wave filter according to claim 1;
   a high-frequency switch; and
   a circuit board including a first principal surface on which the dual-band surface acoustic wave filter and the high-frequency switch are mounted, and a second principal surface facing the first principal surface; wherein
   the dual-band surface acoustic wave filter is located such that a long side of the first principal surface of the circuit board faces the second short side of the dual-band surface acoustic wave filter, and a short side of the first principal surface of the circuit board faces the second long side of the dual-band surface acoustic wave filter;
   the high-frequency switch is located on the first principal surface of the circuit board so as to face the first long side of the dual-band surface acoustic wave filter;
   a plurality of external terminals are arranged on the second principal surface of the circuit board so as to be located on an edge portion on a side ipsilateral to the long side of the first principal surface of the circuit board and along the long side, and so as to be electrically connected to the first and second output terminals; and
   an input side wiring that electrically connects the first and second input terminals to the high-frequency switch and a plurality of output side wirings that electrically connect the plurality of external terminals to the first and second output terminals are located in the circuit board.

12. The composite high-frequency component according to claim 11, further comprising another dual-band surface acoustic wave filter arranged on the first principal surface of the circuit board such that the first long side thereof faces the high-frequency switch, the second short side thereof faces a long side of the first principal surface of the circuit board, and the second long side thereof faces another short side of the first principal surface of the circuit board; wherein
   another plurality of external terminals are arranged on the second principal surface of the circuit board so as to be located on the edge portion of the first principal surface of the circuit board on the long-side side thereof and along the long side with the plurality of external terminals and so as to be electrically connected to first and second output terminals of the other dual-band surface acoustic wave filter; and
   another input side wiring that electrically connects first and second input terminals of the other dual-band surface acoustic wave filter to the high-frequency switch and another plurality of output side wirings that electrically connect the other plurality of external terminals to the first and second output terminals of the other dual-band surface acoustic wave filter are located in the circuit board.

13. The composite high-frequency component according to claim 11, wherein the composite high-frequency component is operative in GSM 1800, GSM 1900, GSM 850 and GSM 900 communication systems.

14. The composite high-frequency component according to claim 13, wherein the high-frequency switch switches between the GSM 1800, GSM 1900, GSM 850 and GSM 900 communication systems.

15. The composite high-frequency component according to claim 11, further comprising third, fourth, fifth and sixth surface acoustic wave filter portions.

16. The composite high-frequency component according to claim 15, wherein the high-frequency switch switches between the first through sixth surface acoustic wave filter portions.

* * * * *